United States Patent

[11] 3,614,650

[72] Inventor Earl L. DeShazo, Jr.
Bartlesville, Okla.
[21] Appl. No. 38,199
[22] Filed May 18, 1970
[45] Patented Oct. 19, 1971
[73] Assignee Phillips Petroleum Company

[54] UNIJUNCTION TRANSISTOR RELAXATION OSCILLATOR WITH RAPID CAPACITOR DISCHARGE CIRCUIT
6 Claims, 2 Drawing Figs.

[52] U.S. Cl. .......... 331/52, 307/265, 307/291, 331/54, 331/75, 331/111
[51] Int. Cl. .......... H03k 3/26
[50] Field of Search .......... 331/52, 54, 75, 111, 113 R; 307/263, 265, 289, 291

[56] References Cited

UNITED STATES PATENTS

| | | | |
|---|---|---|---|
| 3,074,028 | 1/1963 | Mammano | 331/111 |
| 3,156,875 | 11/1964 | Fiorinao et al. | 331/111 |
| 3,289,104 | 11/1966 | McClay et al. | 307/268 X |
| 3,514,622 | 5/1970 | Costa et al. | 331/111 X |

*Primary Examiner*—Roy Lake
*Assistant Examiner*—Siegfried H. Grimm
*Attorney*—Young and Quigg

ABSTRACT: The shape of the output pulses from a unijunction transistor relaxation oscillator is improved by a circuit which rapidly discharges the capacitor of the oscillator. The discharge circuit is actuated by a monostable multivibrator, the input of which is connected to the output of the oscillator.

INVENTOR.
E. L. De SHAZO, JR.
BY Young & Quigg
ATTORNEYS

UNIJUNCTION TRANSISTOR RELAXATION OSCILLATOR WITH RAPID CAPACITOR DISCHARGE CIRCUIT

In the operation of various electronic devices there is a need for an adjustable frequency signal generator or timer. Unijunction transistor relaxation oscillators are commonly employed for this purpose because of their simplicity, reliability and low cost. However, the wave form of the output signal from such an oscillator limits its field of application. The output voltage rises abruptly when the capacitor begins to discharge through the transistor, but the voltage fall is gradual and produces a relatively long trailing edge. This creates problems if the oscillator is used to drive the inputs of high speed integrated circuit logic gates. A slowly changing signal often generates internal oscillations within such a gate so that spurious output pulses are produced. In order to reduce the length of the trailing edge of the output signal from a unijunction transistor oscillator, attempts have been made to incorporate inductors into the circuit. While these inductors reduce the fall time, they sometimes introduce oscillations in associated circuit elements.

In accordance with this invention, an improved unijunction transistor oscillator is provided in which the output signal comprises a series of relatively sharp peaks. This is accomplished by applying the output signal of the oscillator through a monostable multivibrator to an auxiliary circuit for discharging the capacitor at a rapid rate. In another embodiment of this invention, circuit means are provided for selectively controlling the initial charging time of the capacitor in a relaxation oscillator.

In the accompanying drawing.

Figure 1:
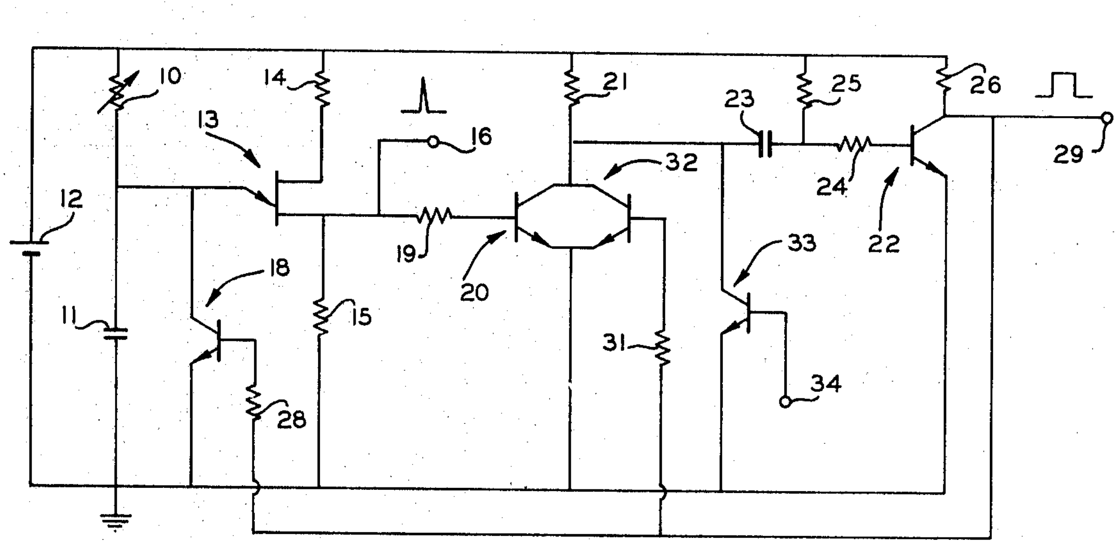
FIG. 1 is a schematic circuit drawing of a first embodiment of the pulse generator of this invention.

Referring now to the drawing in detail and to FIG. 1 in particular, a variable resistor 10 and a capacitor 11 are connected in series relationship with a voltage source 12, the negative terminal of which is connected to ground. The junction between resistor 10 and capacitor 11 is connected to the emitter of a unijunction transistor 13. A resistor 14 is connected between the first base of transistor 13 and the positive terminal of voltage source 12, and a resistor 15 is connected between the second base of transistor 13 and ground. An output terminal 16 is connected to the second base of transistor 13.

The circuit thus far described constitutes a conventional unijunction transistor relaxation oscillator. Capacitor 11 is charged through resistor 10 at a rate which is a function of the value of the resistor. When the charge on capacitor 11 increases to the firing potential of transistor 13, the transistor conducts. The resulting conduction through resistor 15 serves to increase the potential at terminal 16 quite rapidly. This potential then falls slowly as capacitor 11 discharges through the emitter-base 2 junction of transistor 13 and resistor 15. When the potential on capacitor 11 falls to a second value, conduction through the transistor is terminated and capacitor 11 again charges through resistor 10. This operation is repetitive to produce a series of output pulses.

In order to convert the output signal of terminal 16 into a series of relatively sharp pulses, as illustrated, a second transistor 18 is employed to increase the rate at which capacitor 11 is discharged. The junction between resistor 10 and capacitor 11 is connected to the collector of transistor 18. The emitter of transistor 18 is connected to ground. Transistor 18 is fired by the circuit to be described.

The second base of transistor 13 is connected by a resistor 19 to the base of a transistor 20. The emitter of transistor 20 is connected to ground, and the collector is connected by a resistor 21 to the positive terminal of voltage source 12. The collector of transistor 20 is connected to the base of a transistor 22 by a capacitor 23 and a resistor 24 which are connected in series relationship. The junction between capacitor 23 and resistor 24 is connected by a resistor 25 to the positive terminal of voltage source 12. The emitter of transistor 22 is connected to ground, and the collector is connected by a resistor 26 to the positive terminal of voltage source 12. The collector of transistor 22 is connected by a resistor 28 to the base of transistor 18.

During the period that capacitor 11 is charging to the potential sufficient to fire transistor 13, transistor 22 conducts and transistor 20 is nonconducting. When transistor 13 is fired, a positive pulse is applied to the base of transistor 20 to cause this transistor to conduct, thereby discharging capacitor 23. This applies a negative pulse to the base of transistor 22 to cause the transistor to become nonconducting so that the potential at output terminal 29 rises. The resulting positive pulse applied to the base of transistor 18 causes transistor 18 to conduct. This rapidly discharges capacitor 11 and thereby reduces the time that transistor 30 conducts so as to shorten the trailing edge of the pulse appearing at output terminal 16. This results in a series of sharp output pulses being provided by the relaxation oscillator.

The output signal at terminal 29 is also applied through a resistor 31 to the base of a transistor 32. The emitter of transistor 32 is connected to ground, and the collector is connected to resistor 21. The signal thus applied to transistor 32 from transistor 22 insures that transistor 18 is conductive for a sufficient period of time to discharge capacitor 11.

A series of positive output pulses appears at terminal 29. The duration of each pulse is a function of the values of resistor 25 and capacitor 23.

In some operations, particularly when the period of the oscillator is relatively long, it is desirable to provide a reset mechanism. This can be accomplished by transistor 33, the collector of which is connected to capacitor 23. The emitter of transistor 23 is connected to ground. The base of transistor 33 is connected to a terminal 34 which is adapted to receive a positive reset pulse. When such a pulse is applied to terminal 34, capacitor 23 is charged in the manner previously described so that transistor 18 is fired to discharge capacitor 11. This serves to initiate a cycle of the oscillator whenever such a pulse is applied to terminal 34.

Figure 2:
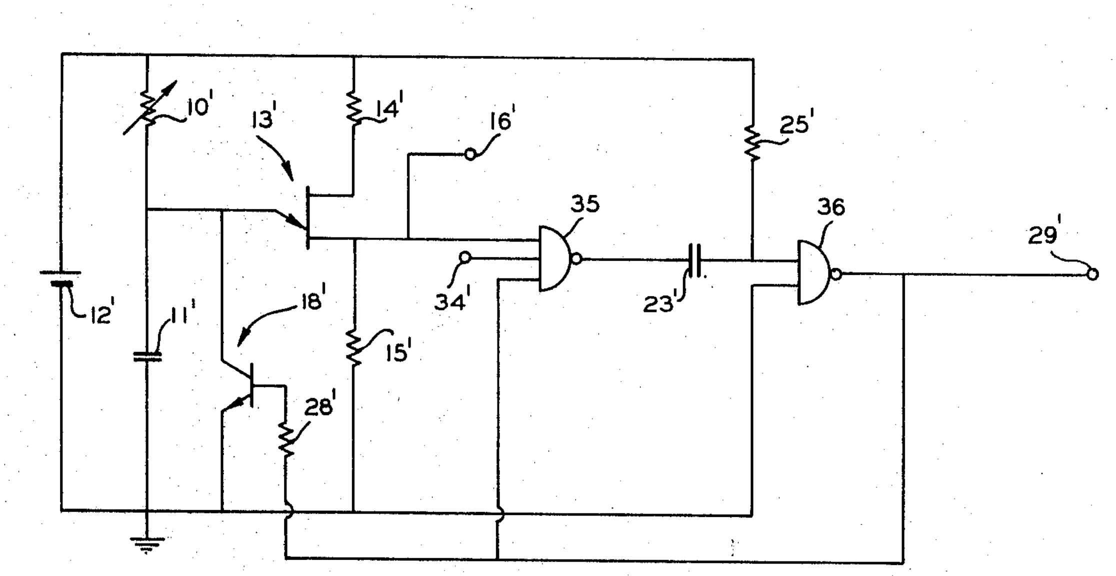
FIG. 2 is a schematic circuit drawing of a second embodiment of the pulse generator.

Certain elements of the circuit of FIG. 1 can be replaced by conventional integrated circuit elements. Such a circuit is illustrated in FIG. 2 wherein transistors 20, 32 and 33 are replaced by an integrated NAND-circuit 35. Transistor 22 is replaced by a single input NAND-circuit 36. Otherwise, the circuit of FIG. 2 is identical to that of FIG. 1 and corresponding elements are designated by like primed reference numerals.

While this invention has been described in conjunction with presently preferred embodiments, it should be evident that it is not limited thereto.

What is claimed is:

1. In a pulse generator formed by a relaxation oscillator which includes a potential source, a first resistor and a capacitor connected in series across said potential source, a unijunction transistor having an emitter and first and second bases, means connecting said emitter to the junction between said first resistor and said capacitor, a second resistor connected between said first base and the positive terminal of said potential source, and a third resistor connected between said second base and the negative terminal of said potential source; the improvement comprising a monostable multivibrator, means connecting said second base to the input of said multivibrator, and means responsive to the output of said multivibrator to discharge said capacitor at a rate greater than the rate at which said capacitor is discharged through said unijunction transistor.

2. The pulse generator of claim 1 wherein said means to discharge said capacitor comprises a second transistor having an emitter, a collector and a base, means connecting the collector of said second transistor to the junction between said first resistor and said capacitor, means connecting the emitter of said second transistor to the negative terminal of said voltage source, and means connecting the output of said multivibrator to the base of said second transistor.

3. The pulse generator of claim 1 wherein said multivibrator comprises second and third transistors, each having an emitter, a collector and a base, means connecting the second base of said unijunction transistor to the base of said second transistor, means connecting the emitters of said second and third transistors to the negative terminal of said potential source, fourth and fifth resistors connected between the positive terminal of said potential source and the collectors of said second and third transistors, respectively, a second capacitor connected between the collector of said second transistor and the base of said third transistor, and a sixth resistor connected between the base of said third transistor and the positive terminal of said potential source.

4. The oscillator of claim 3, further comprising a fourth transistor having an emitter, a collector and a base, means connecting the collector of said fourth transistor to the collector of said second transistor, means connecting the emitter of said fourth transistor to the emitter of said second transistor, and means connecting the output of said multivibrator to the base of said fourth transistor.

5. The oscillator of claim 3, further comprising a fourth transistor having an emitter, a collector and a base, means connecting the collector of said fourth transistor to the collector of said second transistor, and means connecting the emitter of said fourth transistor to the emitter of said second transistor, the base of said fourth transistor being adapted to receive a reset pulse.

6. The oscillator of claim 1 wherein said multivibrator comprises first and second NAND circuits, a second capacitor connected between the output of said first NAND circuit and the input of said second NAND circuit, a third resistor connected between the input of said circuit and the positive terminal of said potential source, and means connecting the output of said second NAND circuit and the second base of said unijunction transistor to respective inputs of said first NAND circuit.

UNITED STATES PATENT OFFICE

CERTIFICATE OF CORRECTION

Patent No. 3,614,650 Dated October 19, 1971

Inventor(s) Earl L. DeShazo, Jr.

It is certified that error appears in the above-identified patent and that said Letters Patent are hereby corrected as shown below:

Column 4, line 13, "second NAND" has been omitted after "said".

Signed and sealed this 30th day of May 1972.

(SEAL)
Attest:

EDWARD M.FLETCHER,JR.
Attesting Officer

ROBERT GOTTSCHALK
Commissioner of Patents